(12) United States Patent
Joo (10) Patent No.: US 8,031,530 B2
(45) Date of Patent: Oct. 4, 2011

(54) METHOD OF PERFORMING READ OPERATION OF NONVOLATILE MEMORY DEVICE

(75) Inventor: Seok Jin Joo, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 63 days.

(21) Appl. No.: 12/613,060

(22) Filed: Nov. 5, 2009

(65) Prior Publication Data

US 2010/0259995 A1 Oct. 14, 2010

(30) Foreign Application Priority Data

Apr. 14, 2009 (KR) .................. 10-2009-0032250

(51) Int. Cl.
*G11C 16/00* (2006.01)
(52) U.S. Cl. .................. 365/185.25; 365/185.18
(58) Field of Classification Search .............. 365/185.02
See application file for complete search history.

(56) References Cited

U.S. PATENT DOCUMENTS

| | | | | |
|---|---|---|---|---|
| 6,819,592 B2 * | 11/2004 | Noguchi et al. | ......... | 365/185.17 |
| 6,907,497 B2 * | 6/2005 | Hosono et al. | ................ | 711/103 |
| 6,922,364 B2 * | 7/2005 | Kojima | .................... | 365/185.33 |
| 6,967,894 B2 * | 11/2005 | Kondo | .................... | 365/185.17 |
| 2002/0039311 A1 * | 4/2002 | Takeuchi et al. | ......... | 365/185.09 |

FOREIGN PATENT DOCUMENTS

KR 1020080084031 9/2008

OTHER PUBLICATIONS

Notice of Allowance issued from Korean Intellectual Property Office on Nov. 30, 2010.

* cited by examiner

*Primary Examiner* — Tan T. Nguyen
(74) *Attorney, Agent, or Firm* — IP & T Group LLP

(57) ABSTRACT

In a method of performing a read operation of a nonvolatile memory device, a selected bit line is precharged. A pass voltage is sequentially applied to all word lines. The pass voltage applied to a word line, selected from among all the word lines, is changed for a read voltage. The read voltage is applied to the selected word line. Data of a memory cell coupled to the selected word line is read.

28 Claims, 4 Drawing Sheets

METHOD OF PERFORMING READ OPERATION OF NONVOLATILE MEMORY DEVICE

CROSS-REFERENCE TO RELATED APPLICATION

Priority to Korean patent application number 10-2009-0032250 filed on Apr. 14, 2009, the entire disclosure of which is incorporated by reference herein, is claimed.

BACKGROUND

One or more embodiments relate to a method of performing a read operation of a nonvolatile memory device and, more particularly, to a method of performing a read operation of a nonvolatile memory device, which is capable of improving reliability of a read operation.

In the read operation of a nonvolatile memory device, data can be read by applying a pre-charge voltage to a bit line electrically coupled to a selected string, applying a read voltage to a word line electrically coupled to a selected memory cell, and sensing a change in the voltage level of the pre-charged bit line.

Figure 1:
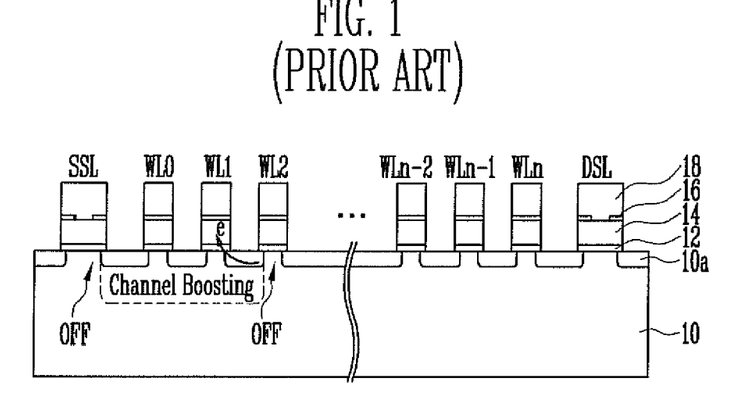
FIG. 1 is a sectional view illustrating the problems of a known nonvolatile memory device.

FIG. 1 is a sectional view illustrating the problems of a known nonvolatile memory device.

Referring to FIG. 1, the nonvolatile memory device includes a plurality of word lines WL0 to WLn (where n is a natural number) formed on a semiconductor substrate 10. The plurality of word lines WL0 to WLn are formed between a source select line SSL and a drain select line DSL. Each of the plurality of word lines WL0 to WLn, the source select line SSL, and the drain select line DSL has a structure in which a gate insulating layer 12, a floating gate 14, a dielectric layer 16, and a control gate 18 are formed over the semiconductor substrate 10. A contact hole is formed in part of each of the dielectric layers 16 formed in the source select line SSL and the drain select line DSL, thereby electrically coupling the floating gate 14 and the control gate 18. Furthermore, a junction 10a is formed in the semiconductor substrate 10 between the source select line SSL and the plurality of word lines WL0 to WLn, between the plurality of word lines WL0 to WLn, and between the plurality of word lines WL0 to WLn and the drain select line DSL.

A read operation on a memory cell coupled to the third word line WL2 of the word lines is described as an example.

In the read operation of the nonvolatile memory device, as described above, a precharge voltage is applied to a bit line electrically coupled to a memory cell to be read. A pass voltage is applied to the word lines WL1 to WLn electrically coupled to unselected memory cells, and a read voltage is applied to the third word line WL2 electrically coupled to a selected memory cell.

If the selected memory cell is a programmed cell and a read voltage level applied to the selected third word line WL2 is lower than a threshold voltage of the programmed cell, a channel is not formed under the selected memory cell. In this case, before a turn-on voltage is applied to the source select line SSL, a source select transistor electrically coupled to the source select line SSL remains in a turn-off state. Accordingly, a channel is also not formed under the source select transistor. As described above, if both the source select transistor and the selected memory cell are in an off state, a channel boosting phenomenon in which the voltage level rises between the turn-off regions can occur. Referring to FIG. 1, channel boosting can occur in the semiconductor substrate 10 between the source select line SSL and the third word line WL2. However, channel boosting does not occur in the semiconductor substrate 10 toward the drain select line DSL. This is because a turn-on voltage is applied to the drain select line DSL in order to transfer voltage of a bit line BL to an active region.

As described above, if a region where channel boosting occurs and a region where channel boosting does not occur exist in the same string, a high electric field can be formed between the region where channel boosting occurs and the region where channel boosting does not occur, and so hot electrons 'e' can be generated. In particular, since the hot electrons 'e' are probably infiltrated into memory cells neighboring the selected memory cell toward the source select line SSL, a threshold voltage distribution of memory cells may shift. That is, an unwanted soft program operation can be performed on the memory cell coupled to the second word line WL1 because of the infiltration of hot electrons 'e'.

If, as described above, the threshold voltage shifts, not only data of the memory cells can be changed, but a width of the threshold voltage distribution of the memory cells can be increased, which may lower reliability of, in particular, a multi-level cell (MLC).

BRIEF SUMMARY

According to one or more embodiments, during a read operation, the occurrence of channel boosting can be suppressed. Accordingly, the occurrence of hot electrons can be prevented, and a shift in the threshold voltage distribution of memory cells resulting from the generated hot electrons can be prevented.

In a method of performing a read operation of a nonvolatile memory device according to a first embodiment, a pass voltage is sequentially applied to all word lines. The pass voltage applied to a selected word line, among all the word lines, is changed for a read voltage. The read voltage is applied to the selected word line. Data of a memory cell coupled to the selected word line is read.

In a method of performing a read operation of a nonvolatile memory device according to a second embodiment, a selected bit line is precharged. A pass voltage is sequentially applied to all word lines and, at the same time, a read voltage is applied to a selected word line. Data of a memory cell coupled to the selected word line is read.

In a memory block including the memory cell, after sequentially applying the pass voltage to all the word lines, the read voltage is applied to the selected word line.

Changing the pass voltage into a read voltage and applying the read voltage to the selected word line comprises discharging the selected word line to which the pass voltage has been applied and applying the read voltage to the selected word line.

Applying the pass voltage to all the word lines comprises sequentially applying the pass voltage to the word lines from a word line adjacent to a drain select line to word lines adjacent to a source select line.

The pass voltage is sequentially applied to all the word lines with a delay time of 10 ns to 10000 ns.

All the word lines are classified into groups each comprising one or more word lines, and the pass voltage is applied to each of the groups.

In a method of performing a read operation of a nonvolatile memory device according to a third embodiment, a plurality of word line groups each comprising one or more word lines are formed. A pass voltage is sequentially applied to all the word lines of all the word line groups. The pass voltage applied to a selected word line, among all the word lines, is changed for a read voltage, and the read voltage is applied to the selected word line. Data of a memory cell coupled to the selected word line is read.

In a method of performing a read operation of a nonvolatile memory device according to a fourth embodiment, a plurality of word line groups each comprising a plurality of word lines is formed. A pass voltage is sequentially applied to all the word lines of all the word line groups and, at the same time, a read voltage is applied to a selected word line. Data of a memory cell coupled to the selected word line is read.

Changing the pass voltage into a read voltage and applying the read voltage to the selected word line comprises discharging the selected word line to which the pass voltage has been applied and applying the read voltage to the selected word line.

Applying the pass voltage to all word lines comprises applying the pass voltage to all the word lines in order of word line groups from a drain select line to a source select line.

The pass voltage is sequentially applied to all the word lines with a delay time of 10 ns to 10000 ns.

In a method of performing a read operation of a nonvolatile memory device according to a fifth embodiment, a selected bit line is precharged. After precharging the selected bit line, a pass voltage is applied to all word lines at the same time. The pass voltage applied to a word line, selected from among all the word lines, is changed for a read voltage, and the read voltage is applied to the selected word line. Data of a memory cell coupled to the selected word line is read.

In a method of performing a read operation of a nonvolatile memory device according to a sixth embodiment, a pass voltage is simultaneously applied to all word lines. A selected bit line is precharged. The pass voltage applied to a selected word line, among all the word lines, is changed for a read voltage, and the read voltage is applied to the selected word line. Data of a memory cell coupled to the selected word line is read.

When applying the pass voltage to all the word lines, both a drain select transistor and a source select transistor are turned on. When changing the pass voltage applied to the selected word line into the read voltage and applying the read voltage to the selected word line, the source select transistor is turned off.

When applying the pass voltage, both the drain select transistor and the source select transistor are turned on.

Changing the pass voltage into a read voltage and applying the read voltage to the selected word line comprises turning off the source select transistor, turning on the source select transistor again when a voltage level of the selected word line reaches the read voltage level, before reading data of the memory cell.

Changing the pass voltage into a read voltage and applying the read voltage to the selected word line comprises discharging the selected word line to which the pass voltage has been applied and then applying the read voltage to the selected word line.

In a method of performing a read operation of a nonvolatile memory device according to a seventh embodiment, a read voltage is applied to a selected word line and, at the same time, a pass voltage is applied to remaining word lines. A selected bit line is precharged. Data of a memory cell coupled to the selected word line is read.

When applying the read voltage or the pass voltage, both a drain select transistor and a source select transistor are turned on.

In the method, channels of a selected string are electrically coupled to the word lines by applying the read voltage or the pass voltage to the word lines, and the source select transistor is then turned off.

Reading data of the memory cell comprises evaluating a shift in a threshold voltage of the selected memory cell and then sensing a change in a voltage of the selected bit line coupled to the selected memory cell.

DESCRIPTION OF EMBODIMENTS

Hereinafter, some embodiments of the present disclosure will be described in detail with reference to the accompanying drawings. The drawing figures are provided to allow those having ordinary skill in the art to understand the scope of the embodiments of the disclosure.

Figure 2:
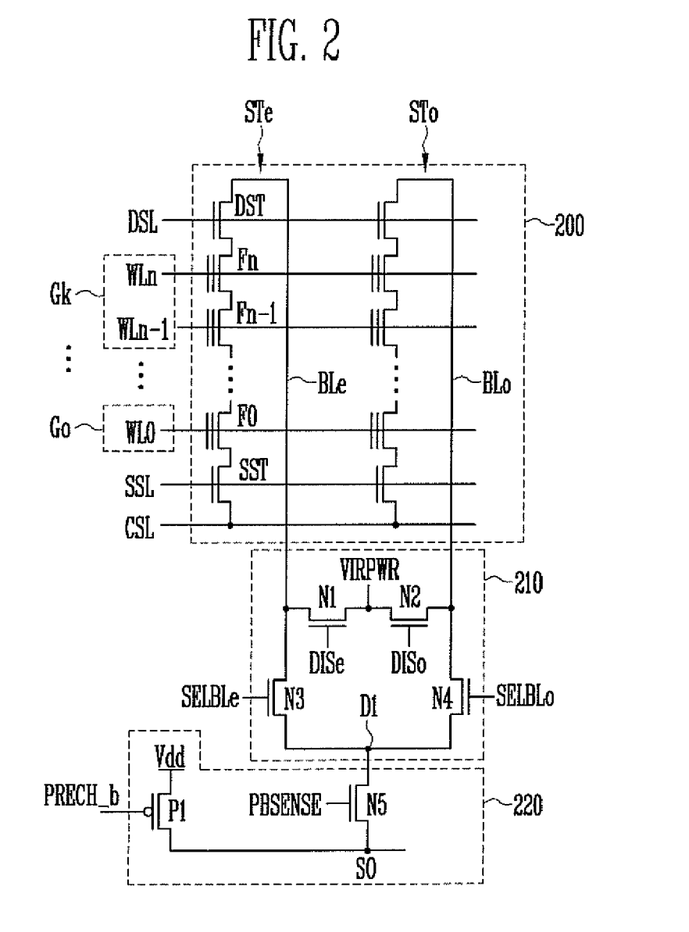
FIG. 2 is a circuit diagram of a nonvolatile memory device.

FIG. 2 is a circuit diagram of a nonvolatile memory device.

The nonvolatile memory device includes a memory cell array 200, a bit line selection unit 210, and a page buffer 220 only part of which is shown in FIG. 2.

The memory cell array 200 includes plural pairs of strings STe and STo. The strings can be classified into even strings STe or odd strings STo according to the position of the string. For example, an even-numbered string can become an even string STe, and an odd-numbered string can become an odd string STo. Thus, the even strings STe and the odd strings STo are alternately arranged in parallel. Each of the strings has the same configuration. The even string STe is described below as an example.

A drain select transistor DST is coupled to the drain terminal of the even string STe, and a source select transistor SST is coupled to the source terminal thereof. A plurality of memory cells F0 to Fn (where n is a natural number) is coupled in series between the drain select transistor DST and the source select transistor SST. The gate terminals of the respective drain select transistors DST coupled to different strings are coupled together to thereby form a drain select line DSL. The gate terminals of the respective source select transistors SST coupled to different strings are coupled together to thereby form a source select line SSL. Furthermore, the gate terminals of the respective memory cells F0 to Fn coupled to different strings are coupled together to thereby form a plurality of word lines WL0 to WLn (where n is a natural number), respectively. The drain terminal of the drain select transistor DST is coupled to a bit line. The even string STe is electrically coupled to an even bit line BLe, and the odd string STo is electrically coupled to an odd bit line BLo.

The bit line selection unit 210 includes a third switch N3 coupled between the even bit line BLe and a first node D1, first and second switches N1 and N2 coupled in series between the even bit line BLe and the odd bit line BLo, and a fourth switch N4 coupled between the odd bit line BLo and the first node D1. Each of the first to fourth switches N1 to N4 can be implemented using an NMOS transistor. A voltage VIRPWR is applied between the first and second switches N1 and N2. The first switch N1 operates in response to an even discharge signal DISe, and the second switch N2 operates in response to an odd discharge signal DISo. The third switch N3 operates in response to an even selection signal SELBLe, and the fourth switch N4 operates in response to an odd selection signal SELBLo.

In FIG. 2, only part of the page buffer 220 is shown in order to describe portions pertinent to this disclosure. The page buffer 220 includes a fifth switch N5 coupled between the first node D1 and a sense node SO and a precharge switch P1 coupled between a power supply voltage (Vdd) and the sense node SO. The fifth switch N5 can be implemented using an NMOS transistor, and the precharge switch P1 can be implemented using a PMOS transistor. The fifth switch N5 operates in response to a sense signal PBSENSE, and the precharge switch P1 operates in response to a precharge signal PRECH_b. A read operation using the above circuit is described in more detail below.

Figure 3:
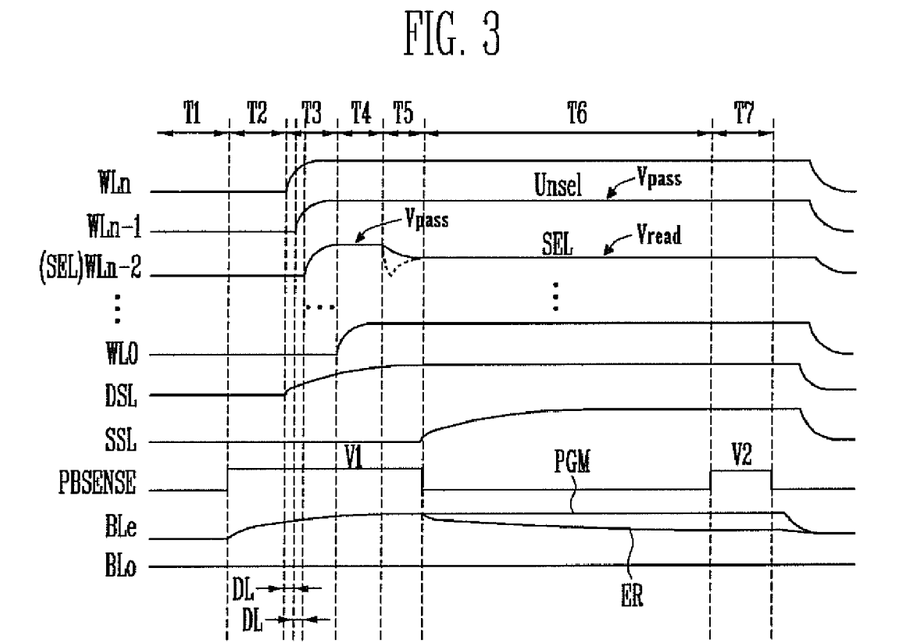
FIG. 3 is a timing diagram illustrating a method of performing a read operation of a nonvolatile memory device according to a first embodiment.

FIG. 3 is a timing diagram illustrating a method of performing a read operation of a nonvolatile memory device according to a first embodiment.

Referring to FIGS. 2 and 3, a pass voltage (Vpass) is sequentially applied to all the word lines, wherein the pass voltage is applied to a selected word line, and a read operation is then performed after the pass voltages are changed for a read voltage (Vread). For example, a case where a memory cell to be read is coupled to the even bit line BLe is described below.

The read operation of the nonvolatile memory device includes a first section T1 where the sense node SO is precharged, a second section T2 where a bit line is precharged, a third section T3 where a pass voltage is applied to word lines, a fourth section T4 where voltage is applied to a channel, a fifth section T5 where a read voltage is applied to a selected word line, a sixth section T6 where an evaluation operation is performed, and a seventh section T7 where data is sensed.

In the first section T1, the sense node SO is precharged. In more detail, the precharge switch P1 is turned on by applying the precharge signal PRECH_b of a logic low level to the precharge switch P1. When the precharge switch P1 is turned on, the power supply voltage (Vdd) is transferred to the sense node SO, thereby precharging the sense node SO.

In the second section T2, a bit line is precharged. In more detail, the sense signal PBSENSE of a first voltage (V1) level is applied to thereby turn on the fifth switch N5. In the case where the even bit line BLe is selected, the third switch N3 is turned on, and the fourth switch N4 is turned off. Thus, the sense node SO and the even bit line BLe are electrically coupled together, and so the even bit line BLe is precharged.

In the third section T3, a word line voltage is applied. In more detail, voltage of a logic high level is applied to the drain select line DSL, thereby turning on the drain select transistor DST. At this time, voltage of a logic low level is applied to the source select line SSL such that the source select transistor SST remains in an off state. Next, a pass voltage (Vpass) is sequentially applied to all the word lines WLn to WL0 (where n is a natural number).

Since the drain select transistor DST is turned on and voltage is thus applied to a corresponding string via the bit line, the pass voltage (Vpass) preferably is sequentially applied to the word lines beginning with the word line WLn neighboring the drain select transistor DST. For example, the pass voltage (Vpass) can be applied to an $n^{th}$ word line WL and, after a lapse of a certain delay time DL, it can be applied to an $(n-1)^{th}$ word line WLn-1. The delay time DL can be set to 10 ns to 10000 ns. Here, 'ns' refers to nano seconds (i.e., the time unit). When the pass voltage (Vpass) is sequentially applied to all the word lines WLn to WL0, all the channels of the corresponding string can be electrically coupled together. Meanwhile, all the word lines can be classified into a plurality of groups Gr0 to GrJ (where J is a natural number) each including two or more word lines. In this case, the pass voltage (Vpass) can be applied to all the word lines of each group.

The fourth section T4 is a channel connection section. A pass voltage (Vpass) is applied to all the word lines WL0 to WLn for a certain period of time. Preferably, each of the memory cells is turned on, and it remains in the turn-on state for a certain period of time such that all the channels are electrically coupled together. For example, during the time of 1000 ns to 10000 ns, the pass voltage (Vpass) can be applied to all the word lines WL0 to WLn such that the channels can be uniformly formed.

In the fifth section T5, a read voltage (Vread) is applied. After the pass voltage (Vpass) is applied to all the word lines within a selected memory block, the pass voltage (Vpass) that has been applied to the selected word line (i.e., a word line coupled to the memory cell to be read) is changed for a read voltage (Vread). For example, in the case where an $(n-1)^{th}$ word line WLn-2 (assuming the first word line is WL0) is a selected word line, the read voltage (Vread) is applied to the $(n-1)^{th}$ word line WLn-2 to which the pass voltage (Vpass) has been applied. Alternatively, after the selected word line to which the pass voltage (Vpass) has been applied is discharged, the read voltage (Vread) can be applied to the selected word line SEL. It can be said that the first to fourth sections are sections where the channels of a selected string are uniformly formed, and the fifth to seventh sections are sections where data of a selected memory cell is read.

The sixth section T6 is an evaluation section. In more detail, when the voltage level of the pass voltage (Vpass) that has been applied to the selected word line WLn-2 is lowered, so the pass voltage (Vpass) is changed for the read voltage (Vread), voltage of a logic high level is applied to the source select line SSL. In the case where a cell is turned off because a threshold voltage distribution level of a selected memory cell is high, channel boosting can be generated. In order to prevent this problem, an evaluation operation is performed while turning on the source select transistor SST. Alternatively, when the read voltage (Vread) is applied to the selected word line in the fifth section T5, voltage of a logic high level can be applied to the source select line SSL. The sense signal PBSENSE is changed from a logic high level to a logic low level and is then applied to the fifth switch N5.

In the state in which a ground voltage (e.g., 0 V) is applied to the common source line CSL, the voltage level of the even bit line BLe that is precharged can be varied according to data of a selected memory cell. For example, in the case where a selected memory cell is an erase cell ER, the voltage level of the even bit line BLe can be lowered. Meanwhile, in the case where a selected memory cell is a programmed cell PGM, the voltage level of the even bit line BLe maintains a logic high level. The voltage level can be a little lowered because of a leakage current.

The seventh section T7 is a sensing section. The sense signal PBSENSE of a second voltage (V2) level is applied. That is, the page buffer 220 and the even bit line BLe that has been evaluated are electrically coupled together, and the page buffer 220 reads data of the selected memory cell by sensing a change in the voltage level of the even bit line BLe.

Figure 4:
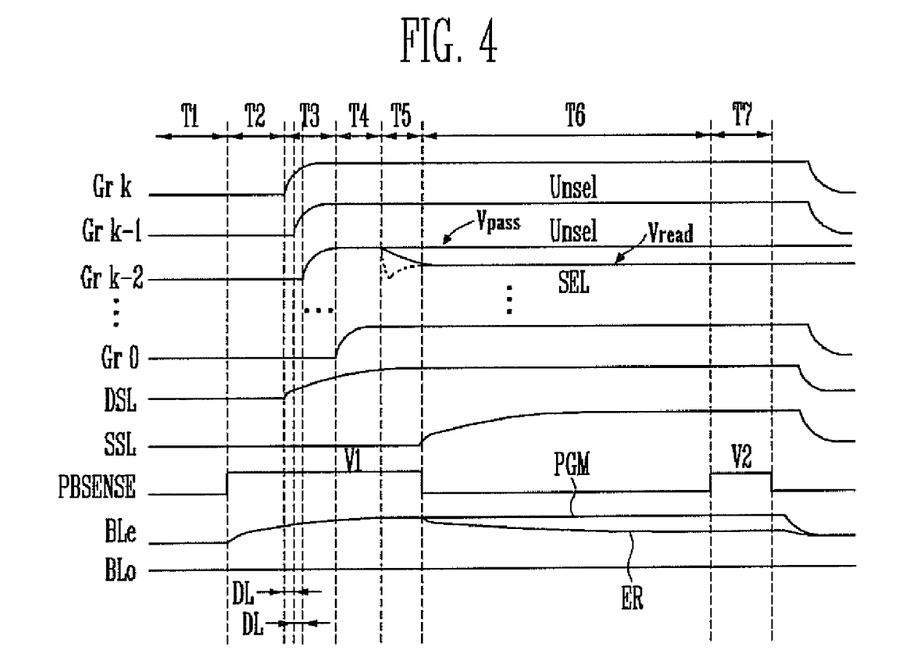
FIG. 4 is a timing diagram illustrating a method of performing a read operation of a nonvolatile memory device according to a second embodiment.

FIG. 4 is a timing diagram illustrating a method of performing a read operation of a nonvolatile memory device according to a second embodiment.

Referring to FIGS. 2 and 4, all the word lines are classified into a plurality of word line groups Gr0 to Grk (where k is a natural number) each including one or more word lines. A pass voltage (Vpass) preferably is applied to all the word lines of each of the word line groups. In particular, after the pass voltage (Vpass) is applied to a selected word line SEL and then applied to all the word lines, the pass voltage (Vpass) applied to the selected word line SEL is changed for a read voltage (Vread), and a read operation is then performed. For example, a case where a memory cell to be read is coupled to the even bit line BLe is described below.

The read operation of the nonvolatile memory device includes a first section T1 where the sense node SO is precharged, a second section T2 where a bit line is precharged, a third section T3 where a pass voltage is applied to word lines, a fourth section T4 where channels are connected, a fifth section T5 where a read voltage is applied, a sixth section T6 where an evaluation operation is performed, and a seventh section T7 where data is sensed.

In the first section T1, the sense node SO is precharged. In more detail, the precharge signal PRECH_b is activated to turn on the precharge switch P1. Thus, the sense node SO is precharged.

In the second section T2, the bit line is precharged. In more detail, the sense signal PBSENSE is activated as a first voltage (V1) level. In the case where the even bit line BLe is selected, the third switch N3 is turned on, and the fourth switch N4 is turned off. Thus, the sense node SO and the even bit line BLe are electrically coupled together, and so the even bit line BLe is precharged.

In the third section T3, a word line voltage is applied. In more detail, voltage of a logic high level is applied to the drain select line DSL, thereby turning on the drain select transistor DST. At this time, voltage of a logic low level is applied to the source select line SSL. Next, a pass voltage (Vpass) is sequentially applied to the word line groups Grk to Gr0 (where k is a natural number). In particular, since the drain select transistor DST is turned on, the pass voltage (Vpass) preferably is sequentially applied to the word line groups beginning with a word line group neighboring the drain select transistor DST. In more detail, the pass voltage (Vpass) is simultaneously applied to all the word lines included in a $k^{th}$ word line group Grk. After a lapse of a certain delay time DL, a pass voltage (Vpass) is simultaneously applied to all the word lines included in a $(k-1)^{th}$ word line group Grk-1. If the pass voltage (Vpass) is sequentially applied to all the word line groups as described above, channels can easily be electrically coupled together. The delay time DL can be set to 10 ns to 10000 ns. Here, 'ns' refers to nano seconds (i.e., the time unit). When the pass voltage (Vpass) is sequentially applied to all the word line groups Grk to Gr0, a precharge voltage of the even bit line BLe is applied to the channels of a selected string.

In the fourth section T4, channels are interconnected. Although channels are electrically coupled together even in the third section, channels can be more effectively coupled together by maintaining a certain period of time. In more detail, in the state in which the pass voltage (Vpass) is applied to all the word line groups Gr0 to Grk, although voltage of a logic low level is applied to the source select line SSL, channel boosting does not occur. In more detail, the pass voltage (Vpass) is applied to all the word lines WL0 to WLn included in all the word line groups Gr0 to Grk for a certain period of time. Preferably, during the time where channels can be sufficiently coupled together, the pass voltage (Vpass) is applied. For example, the pass voltage (Vpass) can be applied for 1000 ns to 10000 ns.

In the fifth section T5, a read voltage is applied. In more detail, a read voltage (Vread) is applied to the selected word line SEL electrically coupled to the memory cell to be read. For example, in the case where the selected word line SEL to be read is included in a $(k-2)^{th}$ word line group Grk-2, the read voltage (Vread) is applied to the selected word line SEL instead of the pass voltage (Vpass) that has been applied to the selected word line SEL. At this time, the pass voltage (Vpass) continues to be applied to the unselected word lines Unsel included in the $(k-2)^{th}$ word line group Grk-2 other than the selected word line SEL, and the pass voltage (Vpass) also continues to be applied to the word lines of other word line groups. Alternatively, when the read voltage (Vread) is applied to the selected word line SEL, the read voltage (Vread) can be applied after discharging the selected word line SEL.

As described above, since the read voltage (Vread) is applied after all the channels of a selected string are coupled together, channel boosting can be prevented from occurring under the word line groups Gr0 to Grk.

Accordingly, the occurrence of hot electrons can be suppressed because a difference in the electric field within the well region of a selected string is not generated. Further, since the occurrence of hot electrons can be suppressed, a shift in the distribution of threshold voltages of memory cells can be prevented.

The sixth section T6 is an evaluation section. In more detail, the source select transistor SST is turned on by applying the sense signal PBSENSE whose voltage level has been changed into a logic low level to the fifth switch N5 and applying voltage of a logic high level to the source select line SSL. At this time, a ground voltage (e.g., 0 V) is applied to the common source line CSL. In the evaluation section, the pass voltage (Vpass) continues to be applied to the word lines of unselected word line groups Grk, Grk-1, and Grk-3 to Gr0, and the read voltage (Vread) continues to be applied to the selected word line SEL. In the case where a memory cell coupled to the selected word line SEL is an erased cell or the threshold voltage level of a memory cell is lower than a read voltage, the memory cell is turned on. Thus, voltage of the even bit line BLe is lowered (ER). Meanwhile, in the case where a threshold voltage level of the memory cell coupled to the selected word line SEL is higher than the read voltage, the memory cell is turned off. Thus, the voltage of the even bit line BLe remains intact (PGM).

The seventh section T7 is a sensing section. The sense signal PBSENSE of a second voltage (V2) level is applied to the fifth switch N5. Thus, the even bit line BLe and the sense node SO of the page buffer 220 are electrically coupled together, and the page buffer 220 reads data of the selected memory cell by sensing a change in the voltage level of the sense node SO.

Figure 5:
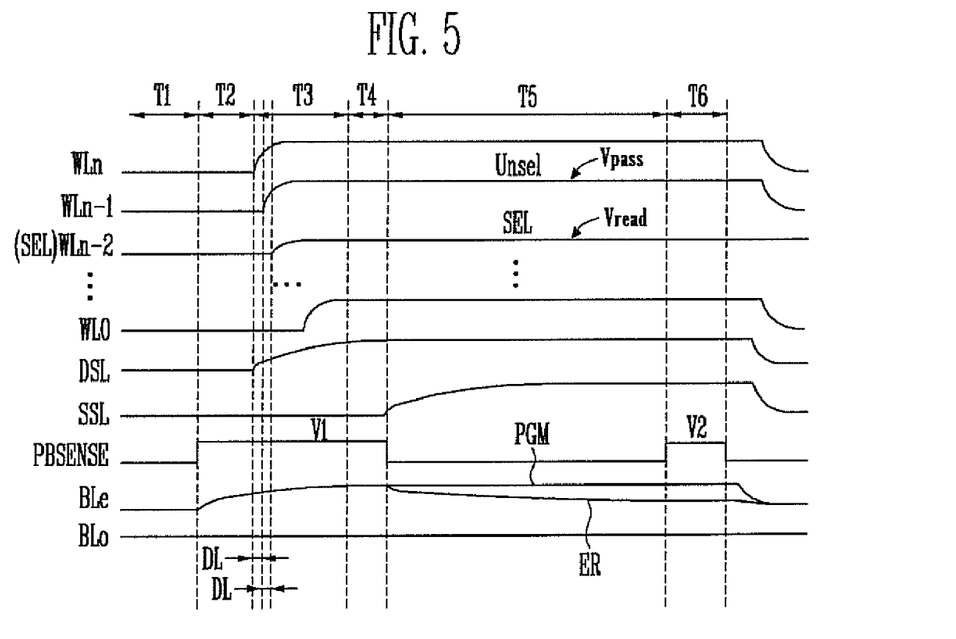
FIG. 5 is a timing diagram illustrating a method of performing a read operation of a nonvolatile memory device according to a third embodiment.

FIG. 5 is a timing diagram illustrating a method of performing a read operation of a nonvolatile memory device according to a third embodiment.

Referring to FIGS. 2 and 5, the read operation of a nonvolatile memory device includes a first section T1 where the sense node SO is precharged, a second section T2 where a bit line is precharged, a third section T3 where voltage is applied to word lines, a fourth section T4 where voltage is applied to a channel, a fifth section T5 where an evaluation operation is performed, and a sixth section T6 where data is sensed.

In the first section T1, the sense node SO is precharged. In more detail, the precharge switch P1 is turned on by applying the precharge signal PRECH_b of a logic low level to the precharge switch P1. When the precharge switch P1 is turned on, the power supply voltage (Vdd) is transferred to the sense node SO, thereby precharging the sense node SO.

In the second section T2, a bit line is precharged. In more detail, the sense signal PBSENSE of a first voltage (V1) level is applied to thereby turn on the fifth switch N5. In the case where the even bit line BLe is selected, the third switch N3 is turned on, and the fourth switch N4 is turned off. Thus, the sense node SO and the even bit line BLe are electrically coupled together, and so the even bit line BLe is precharged.

In the third section T3, voltage is applied to word lines. In more detail, voltage of a logic high level is applied to the drain select line DSL, thereby turning on the drain select transistor DST. At this time, voltage of a logic low level is applied to the source select line SSL such that the source select transistor SST maintains an off state. Next, a driving voltage is sequentially applied to all the word lines. Here, a read voltage (Vread) is applied to a selected word line SEL, and a pass voltage (Vpass) is applied to the remaining unselected word lines Unsel.

Since the drain select transistor DST is turned on and voltage is thus applied to a corresponding string via the bit line, the pass voltage (Vpass) preferably is sequentially applied to the word lines beginning with the word line WLn neighboring the drain select transistor DST. For example, the pass voltage (Vpass) can be applied to an $n^{th}$ word line WL and, after a lapse of a certain delay time DL, it can be applied to an $(n-1)^{th}$ word line WLn-1. The delay time DL can be set to 10 ns to 10000 ns. Here, 'ns' refers to nano seconds (i.e., the time unit). When the pass voltage (Vpass) or the read voltage (Vread) is sequentially applied to all the word lines WLn to WL0, the channels of the corresponding string can be easily coupled together.

The fourth section T4 is a channel connection section. A pass voltage (Vpass) is applied to all the word lines WL0 to WLn for a certain period of time. Preferably, each of the memory cells is turned on, and it maintains the turn-on state for a certain period of time such that all the channels are electrically coupled together. For example, during the time of 1000 ns to 10000 ns, the pass voltage (Vpass) can be applied to all the word lines WL0 to WLn such that the channels can be uniformly formed.

The fifth section T5 is an evaluation section. In more detail, voltage of a logic high level is applied to the source select line SSL to thereby turn on the source select transistor SST. At the same time, the voltage level of the sense signal PBSENSE is changed into a logic low level and applied to the fifth switch N5.

In the state in which a ground voltage (e.g., 0 V) is applied to the common source line CSL, the voltage level of the precharged even bit line BLe can be varied according to data of a selected memory cell. For example, in the case where a selected memory cell is an erased cell or the threshold voltage level of a memory cell is lower than a read voltage, the voltage level of the even bit line BLe is lowered (ER). Meanwhile, in the case where the threshold voltage level of a selected memory is higher than a read voltage, the voltage level of the even bit line BLe maintains a logic high level (PGM).

The sixth section T6 is a sensing section. The sense signal PBSENSE of a second voltage (V2) is applied to the fifth switch N5. That is, the page buffer 220 and the even bit line BLe that has been evaluated are electrically coupled together, and the page buffer 220 reads data of the selected memory cell by sensing a change in the voltage level of the even bit line BLe.

Figure 6:
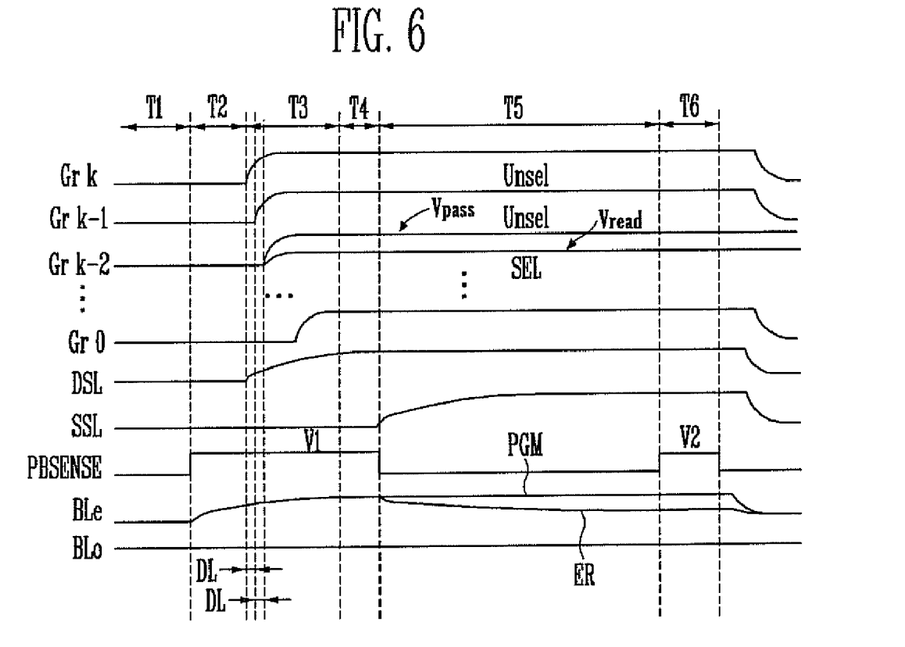
FIG. 6 is a timing diagram illustrating a method of performing a read operation of a nonvolatile memory device according to a fourth embodiment.

FIG. 6 is a timing diagram illustrating a method of performing a read operation of a nonvolatile memory device according to a fourth embodiment.

Referring to FIGS. 2 and 6, all the word lines are classified into a plurality of word line groups Gr0 to Grk (k is a natural number) each including one or more word lines, and voltage is sequentially applied to all the word lines of each of the word line groups. Here, in a word line group including a selected word line SEL, a read voltage (Vread) is applied to the selected word line SEL, and a pass voltage (Vpass) is simultaneously applied to unselected word lines Unsel of the word line group. Meanwhile, a pass voltage (Vpass) is simultaneously applied to all the word lines of word line groups not including the selected word line SEL. For example, a case where a memory cell to be read is coupled to the even bit line BLe is described below.

The read operation of the nonvolatile memory device includes a first section T1 where the sense node SO is precharged, a second section T2 where a bit line is precharged, a third section T3 where voltage is applied to word lines, a fourth section T4 where channels are coupled together, a fifth section T5 where an evaluation operation is performed, and a sixth section T6 where data is sensed.

In the first section T1, the sense node SO is precharged. In more detail, the precharge switch P1 is turned on by applying the precharge signal PRECH_b of a logic low level to the precharge switch P1. In response thereto, the power supply voltage (Vdd) is transferred to the sense node SO, thereby precharging the sense node SO.

In the second section T2, a bit line is precharged. In more detail, the sense signal PBSENSE of a first voltage (V1) level is applied to thereby precharge the even bit line BLe. For example, in the case where the even bit line BLe is selected, the third switch N3 can be turned on, and the fourth switch N4 can be turned off. Thus, the sense node SO and the even bit line BLe are electrically coupled together, and so the even bit line BLe is precharged.

In the third section T3, voltage is applied to word lines. In more detail, voltage of a logic high level is applied to the drain select line DSL, thereby turning on the drain select transistor DST. At this time, voltage applied to the source select line SSL maintains a logic low level. Next, a driving voltage (a pass voltage or a read voltage) is sequentially applied to the word line groups Grk to Gr0 (where k is a natural number). Preferably, the pass voltage (Vpass) is applied to the unselected word lines Unsel of the word line groups Grk to Gr0, and the read voltage (Vread) is applied to the selected word line SEL.

Since the drain select transistor DST is turned on, the driving voltage (the pass voltage or the read voltage) preferably is sequentially applied to the word lines beginning with a word line group neighboring the drain select transistor DST. In more detail, the pass voltage (Vpass) is simultaneously applied to all the word lines included in a $k^{th}$ word line group Grk. Next, after a lapse of a certain delay time DL, the pass voltage (Vpass) is simultaneously applied to all the word lines included in a $(k-1)^{th}$ word line group Grk−1. In particular, in a word line group Grk−2 including the selected word line SEL, the read voltage (Vread) is applied to the selected word line SEL, and the pass voltage (Vpass) is simultaneously applied to the remaining unselected word lines Unsel. The delay time DL between the word line groups is set to 10 ns to 10000 ns. Here, 'ns' (I.e., the time unit) refers to 'nano seconds'. If the driving voltage (the pass voltage or the read voltage) is sequentially applied to all the word line groups Grk to Gr0 as described above, the channels of a selected string can easily be electrically coupled together, and the occurrence of channel boosting can be suppressed.

In the fourth section T4, a state in which voltages are applied to all word lines included in all word line groups remains intact. In more detail, a pass voltage (Vpass) or a read voltage (Vread) is applied to all the word lines WL0 to WLn included in all the word line groups Gr0 to Grk for a certain period of time. Preferably, the voltage (Vpass) or (Vread) is applied during the time where the channels can be sufficiently electrically coupled together. For example, the voltage (Vpass) or (Vread) preferably is applied during the time of 1000 ns to 10000 ns.

The fifth section T5 is an evaluation section. In more detail, the sense signal PBSENSE whose voltage level has changed into a logic low level is applied to the fifth switch N5, and voltage of a logic high level is applied to the source select line SSL, thereby turning on the source select transistor SST. At this time, a ground voltage (e.g., 0 V) is applied to the common source line CSL. In the evaluation section, the pass voltage (Vpass) continues to be applied to all the word lines of unselected word line groups Grk, Grk−1, and Grk−3 to Gr0, and the read voltage (Vread) continues to be applied to the selected word line SEL. In the case where the threshold voltage level of a memory cell coupled to the selected word line SEL is higher than the read voltage (Vread), a channel voltage remains intact because the selected memory cell is turned off. That is, the voltage level of the even bit line BLe remains intact (PGM). Meanwhile, in the case where a memory cell coupled to the selected word line SEL is an erased cell ER or the threshold voltage of the memory cell is lower than the read voltage (Vread), the voltage level of a channel is lowered because the selected memory cell is turned on. That is, the voltage level of the even bit line BLe is lowered (ER).

The sixth section T6 is a sensing section. The sense signal PBSENSE of a second voltage (V2) is applied to the fifth switch N5, thereby electrically coupling the sense node SO of the page buffer 220 and the even bit line BLe. Accordingly, the page buffer 220 can read data of the selected memory cell by sensing a change in the voltage level of the sense node SO of the page buffer 220.

Figure 7:
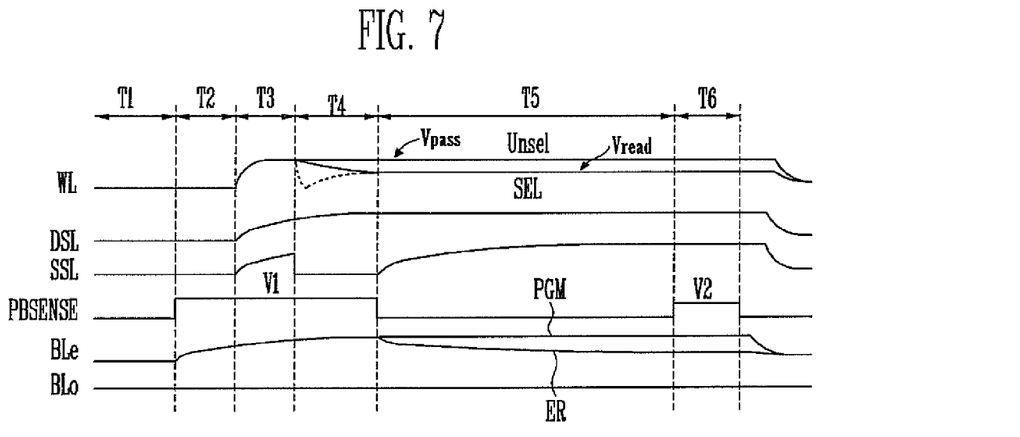
FIG. 7 is a timing diagram illustrating a method of performing a read operation of a nonvolatile memory device according to a fifth embodiment.

FIG. 7 is a timing diagram illustrating a method of performing a read operation of a nonvolatile memory device according to a fifth embodiment.

Referring to FIGS. 2 and 7, after precharging the selected bit line, a pass voltage is simultaneously applied to all the word lines. Next, a pass voltage that has been applied to a selected word line is changed for a read voltage, and a read operation is then performed. For example, a case where a memory cell to be read is coupled to the even bit line BLe is described below.

The read operation of the nonvolatile memory device includes a first section T1 where the sense node SO is precharged, a second section T2 where a bit line is precharged, a third section T3 where a pass voltage is applied to word lines, a fourth section T4 where a read voltage is applied, a fifth section T5 where an evaluation operation is performed, and a sixth section T6 where data is sensed.

In the first section T1, the sense node SO is precharged. In more detail, the precharge switch P1 is turned on by applying the precharge signal PRECH_b of a logic low level to the precharge switch P1. In response thereto, the power supply voltage (Vdd) is transferred to the sense node SO, thereby precharging the sense node SO.

In the second section T2, a bit line is precharged. In more detail, the sense signal PBSENSE of a first voltage (V1) level is activated. For example, in the case where the even bit line BLe is selected, the third switch N3 can be turned on, and the fourth switch N4 can be turned off. Thus, the sense node SO and the even bit line BLe are electrically coupled together, and so the even bit line BLe is precharged.

In the third section T3, voltage is applied to word lines. In more detail, a pass voltage (Vpass) is simultaneously applied to all the word lines WL0 to WLn, thereby electrically coupling channels. At this time, voltage of a logic high level is applied to the drain select line DSL and the source select line SSL, thereby turning on the drain select transistor DST and the source select transistor SST. In particular, since the source select transistor SST is turned on, channel boosting can be prevented from occurring although the pass voltage (Vpass) is simultaneously applied to all the word lines. Here, the pass voltage (Vpass) preferably is applied to all the word lines WL0 to WLn during the time of 1000 ns to 10000 ns in order to maintain channels. As described above, since the pass voltage (Vpass) is applied to all the word lines WL0 to WLn, the channels can be electrically coupled together. Further, since the source select transistor SST is turned on, the occurrence of channel boosting can be prevented.

In the fourth section T4, a read voltage is applied. A read voltage (Vread) is applied to a selected word line SEL electrically coupled to a memory cell to be read. In more detail, the pass voltage (Vpass) that has been applied to the selected word line SEL is changed for the read voltage (Vread), and the read voltage (Vread) is then applied to the selected word line SEL. Alternatively, after discharging the selected word line SEL to which the pass voltage (Vpass) has been applied, the read voltage (Vread) can be applied to the selected word line SEL. At this time, a voltage whose level has changed into a logic low level is applied to the source select line SSL. That is, since the read voltage (Vread) is applied after electrically coupling the channels, channel boosting can be prevented from occurring. Accordingly, a shift in the distribution of threshold voltages of memory cells can be prevented because the occurrence of hot electrons can also be suppressed. At this time, the pass voltage (Vpass) continues to be applied to the remaining unselected word lines Unsel.

The fifth section T5 is an evaluation section. In more detail, the sense signal PBSENSE whose voltage level has changed into a logic low level is applied to the fifth switch N5, and voltage of a logic high level is applied to the source select line SSL, thereby turning on the source select transistor SST. At this time, a ground voltage (e.g., 0 V) is applied to the common source line CSL. In the evaluation section, the pass voltage (Vpass) continues to be applied to all the unselected word lines, and the read voltage (Vread) continues to be applied to the selected word line SEL. In the case where the threshold voltage level of a memory cell coupled to the selected word line SEL is higher than the read voltage (Vread), voltage of the even bit line BLe is maintained (PGM) because the selected memory cell is turned off. Meanwhile, in the case where a memory cell coupled to the selected word line WLn−2 is an erased cell or the threshold voltage of the memory cell is lower than the read voltage (Vread), the voltage level of the even bit line BLe is lowered (ER) because the selected memory cell is turned on.

The sixth section T6 is a sensing section. The sense signal PBSENSE of a second voltage (V2) is applied to the fifth switch N5, thereby electrically coupling the sense node SO of the page buffer 220 and the even bit line BLe. Accordingly, the page buffer 220 can read data of the selected memory cell by sensing a change in the voltage level of the sense node SO of the page buffer 220.

Figure 8:
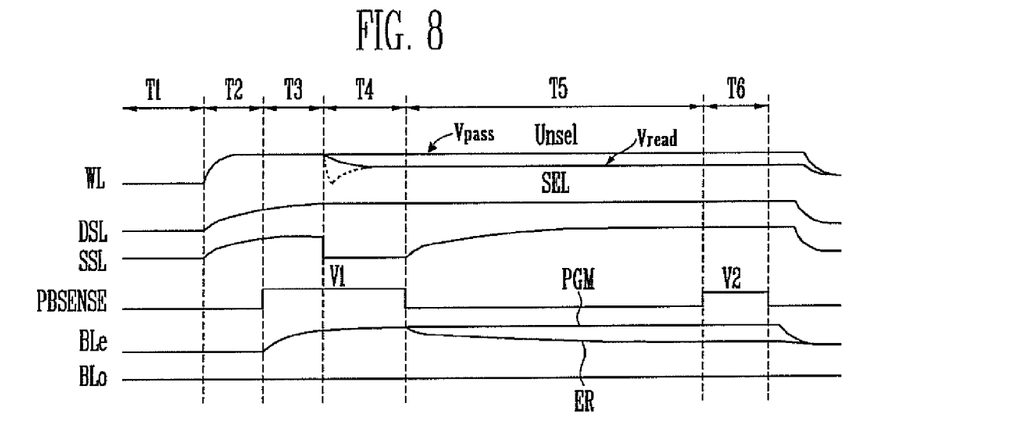
FIG. 8 is a timing diagram illustrating a method of performing a read operation of a nonvolatile memory device according to a sixth embodiment.

FIG. 8 is a timing diagram illustrating a method of performing a read operation of a nonvolatile memory device according to a sixth embodiment.

In the method of operating the read operation, after electrically coupling channels by simultaneously applying a pass voltage to all the word lines, a read voltage is applied to a selected word line. The read operation is described below in more detail.

Referring to FIGS. 2 and 8, the read operation of the nonvolatile memory device includes a first section T1 where the sense node SO is precharged, a second section T2 where channels are coupled together, a third section T3 where a bit line is precharged, a fourth section T4 where a read voltage is applied, a fifth section T5 where an evaluation operation is performed, and a sixth section T6 where data is sensed.

In the first section T1, the sense node SO is precharged. In more detail, the precharge switch P1 is turned on by applying the precharge signal PRECH_b of a logic low level to the precharge switch P1. When the precharge switch P1 is turned on, the power supply voltage (Vdd) is transferred to the sense node SO, thereby precharging the sense node SO.

In the second section T2, a pass voltage (Vpass) is simultaneously applied to all the word lines WL. When the pass voltage (Vpass) is applied to all the word lines WL, channels are electrically coupled together under the memory cells coupled to the word lines WL. At this time, the drain select transistor DST and the source select transistor SST are turned on by applying voltage of a logic high level to the drain select line DSL and the source select line SSL. In the case where a ground voltage (Vss) has been applied to the common source line CSL, the bit line is discharged and reset.

In the third section T3, the even bit line BLe is precharged. When the sense signal PBSENSE of a first voltage (V1) is applied to the fifth switch N5, the sense node SO that has been precharged and the even bit line BLe are electrically coupled together, and so the even bit line BLe is precharged. In this case, since the source select transistor SST is turned on, the even bit line BLe is slowly precharged.

In the fourth section T4, a read voltage (Vread) is applied to a selected word line SEL. Preferably, while the voltage of a logic high level that has been applied to the source select line SSL is changed into a logic low level and then applied to the source select line SSL, the read voltage (Vread) is applied to the selected word line SEL. In more detail, instead of the pass voltage (Vpass) that has been applied to the selected word line SEL, the read voltage (Vread) is applied to the selected word line SEL. Alternatively, the selected word line SEL to which the pass voltage (Vpass) has been applied can be discharged, and the read voltage (Vread) can be then applied to the selected word line SEL. In this case, since the read voltage (Vread) is applied in the state in which all the channels are coupled to a selected string, the occurrence of channel boosting can be suppressed. Accordingly, since the occurrence of hot electrons can be prohibited, a shift in the threshold voltage distributions of the memory cells can be prevented. In this case, the pass voltage (Vpass) continues to be applied to the remaining unselected word lines Unsel.

The fifth section T5 is an evaluation section. In more detail, the sense signal PBSENSE whose voltage level has changed from a logic high level to a logic low level is applied to the fifth switch N5, and voltage of a logic high level is applied to the source select line SSL, thereby turning on the source select transistor SST. At this time, a ground voltage (e.g., 0 V) is applied to the common source line CSL. In the evaluation section the pass voltage (Vpass) continues to be applied to the unselected word lines Unsel, and the read voltage (Vread) continues to be applied to the selected word line SEL. When the source select transistor SST is turned on, the voltage level of the even bit line BLe is varied according to a data state of the memory cell coupled to the selected word line SEL. For example, in the case where the threshold voltage level of a memory cell coupled to the selected word line SEL is higher than a read voltage, a channel voltage is maintained (PGM) because the selected memory cell is turned off. Meanwhile, in the case where a memory cell coupled to the selected word line SEL is an erased cell or the threshold voltage of the memory cell is lower than a read voltage, the voltage level of the channel is lowered (ER) because the selected memory cell is turned on.

In the sixth section T6, after evaluation for the selected memory cell is completed, the sense signal PBSENSE of a second voltage (V2) is applied to the fifth switch N5, thereby electrically coupling the sense node SO of the page buffer 220 and the even bit line BLe. Accordingly, the page buffer 220 can read data of the selected memory cell by sensing a change in the voltage level of the sense node SO of the page buffer 220.

Figure 9:
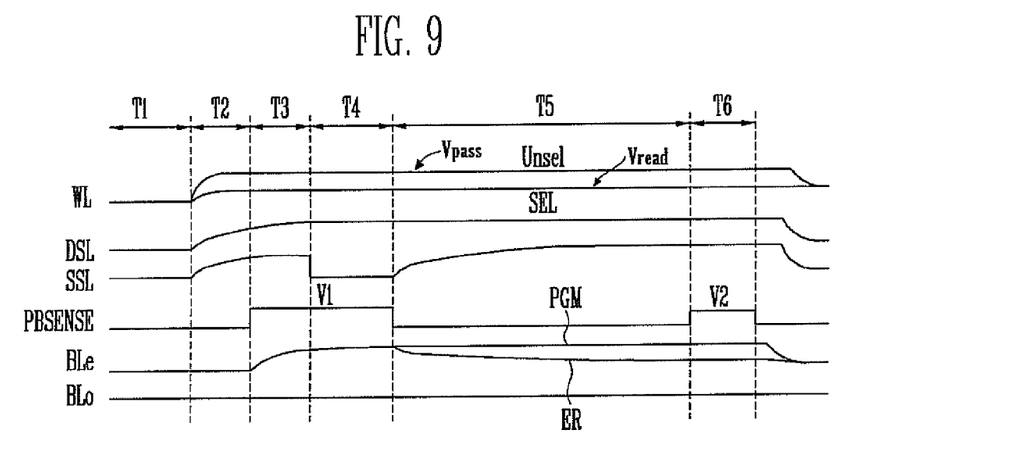
FIG. 9 is a timing diagram illustrating a method of performing a read operation of a nonvolatile memory device according to a seventh embodiment.

FIG. 9 is a timing diagram illustrating a method of performing a read operation of a nonvolatile memory device according to a seventh embodiment.

In the method of operating the read operation, after electrically coupling channels by simultaneously applying a pass voltage or a read voltage to all the word lines, the read operation is performed. The method is described below in more detail.

Referring to FIGS. 2 and 9, the read operation of the nonvolatile memory device includes a first section T1 where the sense node SO is precharged, a second section T2 where channels are coupled together, a third section T3 where a bit line is precharged, a fourth section T4 where a read voltage is applied, a fifth section T5 where an evaluation operation is performed, and a sixth section T6 where data is sensed.

In the first section T1, the sense node SO is precharged. In more detail, the precharge switch P1 is turned on by applying the precharge signal PRECH_b of a logic low level to the precharge switch P1. When the precharge switch P1 is turned on, the power supply voltage (Vdd) is transferred to the sense node SO, thereby precharging the sense node SO.

In the second section T2, a pass voltage (Vpass) is applied to unselected word lines Unsel, and a read voltage (Vread) is simultaneously applied to a selected word line SEL. At this time, voltage of a logic high level is applied to the drain select line DSL and the source select line SSL, thereby turning on the drain select transistor DST and the source select transistor SST. Although the pass voltage (Vpass) or the read voltage (Vread) is applied to the word lines WL, channel boosting does not occur because both the drain and source select transistors DST and SST are turned on.

In the third section T3, the even bit line BLe is precharged. In more detail, the sense signal PBSENSE of a first voltage (V1) level is applied. Thus, the sense node SO that has been precharged and the even bit line BLe are electrically coupled together, and so the even bit line BLe is precharged. In this case, since the source select transistor SST is turned on, the even bit line BLe is slowly precharged.

In the fourth section T4, the voltage that has been applied to the source select line SSL is changed into a logic low level and then applied to the source select line SSL, thereby turning off the source select transistor SST. In this case, the precharge level of the even bit line BLe which has a sufficient level for the read operation can be secured. Although the source select transistor SST has been turned off and a channel under the selected memory cell is inactivated by the read voltage (Vread) applied to the selected word line SEL, the occurrence of channel boosting can be prohibited because the channel has already been electrically coupled.

The fifth section T5 is an evaluation section. In more detail, the sense signal PBSENSE whose voltage level has changed from a logic high level to a logic low level is applied to the fifth switch N5, and voltage of a logic high level is applied to the source select line SSL, thereby turning on the source select transistor SST. At this time, a ground voltage (e.g., 0 V) is applied to the common source line CSL. In the evaluation section the pass voltage (Vpass) continues to be applied to the unselected word lines Unsel, and the read voltage (Vread) continues to be applied to the selected word line SEL. When the source select transistor SST is turned on, the voltage level of the even bit line BLe is varied according to a data state of the memory cell coupled to the selected word line SEL. For example, in the case where the threshold voltage level of a memory cell coupled to the selected word line SEL is higher than a read voltage, a channel voltage is maintained (PGM) because the selected memory cell is turned off. Meanwhile, in the case where a memory cell coupled to the selected word line SEL is an erased cell or the threshold voltage of the memory cell is lower than a read voltage, the voltage level of the channel is lowered (ER) because the selected memory cell is turned on.

In the sixth section T6, after evaluation for the selected memory cell is completed, the sense signal PBSENSE of a second voltage (V2) is applied to the fifth switch N5, thereby electrically coupling the sense node SO of the page buffer 220 and the even bit line BLe, Accordingly, the page buffer 220 can read data of the selected memory cell by sensing a change in the voltage level of the sense node SO of the page buffer 220.

As described above, after electrically coupling the channels of a selected string, a read operation is performed. Thus, channel boosting can be prevented from occurring within the entire selected string or in part of the selected string. Since the occurrence of channel boosting can be suppressed, a region where a difference in the electric field occurs can be prevented, and so the occurrence of hot electrons can be prevented. Since the introduction of hot electrons into memory cells can be prevented, a shift in the threshold voltage distribution can be prevented, and so reliability of a nonvolatile memory device can be improved.

According to the embodiments of this disclosure, the occurrence of hot electrons can be prevented by prohibiting channel boosting from occurring in a read operation. Thus, a shift in the threshold voltage distribution of memory cells can be prevented, and an increase in the threshold voltage distribution width can be prevented. Accordingly, reliability of a nonvolatile memory device can be improved.

What is claimed is:

1. A method of performing a read operation of a nonvolatile memory device, the method comprising:
    precharging a selected bit line;
    sequentially applying a pass voltage to all word lines;
    changing the pass voltage applied to a selected word line among all the word lines into a read voltage;
    applying the read voltage to the selected word line; and
    reading data of a memory cell coupled to the selected word line.

2. The method of claim 1, further comprises:
    discharging the selected word line before applying the read voltage to the selected word line.

3. The method of claim 1, wherein applying the pass voltage to all the word lines comprises sequentially applying the pass voltage to the word lines from a word line adjacent to a drain select line to word lines adjacent to a source select line.

4. The method of claim 3, wherein the pass voltage is sequentially applied to all the word lines with a delay time of 10 ns to 10000 ns.

5. The method of claim 1, wherein all the word lines are classified into groups each comprising one or more word lines, and the pass voltage is applied to each of the groups.

6. The method of claim 1, wherein reading data of the memory cell further comprises:
    evaluating a shift in a threshold voltage of the selected memory cell; and
    sensing a change in a voltage of the selected bit line coupled to the selected memory cell.

7. The method of claim 1, further comprises:
    turning on a drain select transistor and a source select transistor when the applying the pass voltage to all the word lines; and
    turning off the source select transistor when changing the pass voltage applied to the selected word line into the read voltage and applying the read voltage to the selected word line.

8. The method of claim 7, further comprises:
    turning on the source select transistor again when a voltage level of the selected word line reaches the read voltage level, before reading data of the memory cell.

9. A method of performing a read operation of a nonvolatile memory device, the method comprising:
    precharging a selected bit line;
    sequentially applying a pass voltage to all word lines and simultaneously applying a read voltage to a selected word line; and
    reading data of a memory cell coupled to the selected word line.

10. The method of claim 9, wherein applying the pass voltage to all the word lines comprises sequentially applying the pass voltage to the word lines from a word line adjacent to a drain select line to word lines adjacent to a source select line.

11. The method of claim 10, wherein the pass voltage is sequentially applied to all the word lines with a delay time of 10 ns to 10000 ns.

12. The method of claim 9, wherein all the word lines are classified into groups each comprising one or more word lines, and the pass voltage is applied to each of the groups.

13. The method of claim 9, wherein reading data of the memory cell further comprises:
    evaluating a shift in a threshold voltage of the selected memory cell; and
    sensing a change in a voltage of the selected bit line coupled to the selected memory cell.

14. A method of performing a read operation of a nonvolatile memory device, the method comprising:
    forming a plurality of word line groups each comprising one or more word lines;
    sequentially applying a pass voltage to all word lines of all the word line groups;

changing the pass voltage applied to a selected word line among all the word lines into a read voltage;

applying the read voltage to the selected word line; and reading data of a memory cell coupled to the selected word line.

15. The method of claim 14, further comprises:

discharging the selected word line before applying the read voltage to the selected word line.

16. The method of claim 14, wherein applying the pass voltage to all word lines comprises applying the pass voltage to all the word lines in order of word line groups from a drain select line to a source select line.

17. The method of claim 14, wherein the pass voltage is sequentially applied to all the word lines with a delay time of 10 ns to 10000 ns.

18. The method of claim 14, wherein reading data of the memory cell further comprises:

evaluating a shift in a threshold voltage of the selected memory cell; and sensing a change in a voltage of the selected bit line coupled to the selected memory cell.

19. A method of performing a read operation of a nonvolatile memory device, the method comprising:

forming a plurality of word line groups each comprising a plurality of word lines;

sequentially applying a pass voltage to all word lines of all the word line groups and simultaneously applying a read voltage to a selected word line; and reading data of a memory cell coupled to the selected word line.

20. The method of claim 19, wherein applying the pass voltage to all word lines comprises applying the pass voltage to all the word lines in order of word line groups from a drain select line to a source select line.

21. The method of claim 19, wherein the pass voltage is sequentially applied to all the word lines with a delay time of 10 ns to 10000 ns.

22. The method of claim 19, wherein reading data of the memory cell further comprises:

evaluating a shift in a threshold voltage of the selected memory cell; and sensing a change in a voltage of the selected bit line coupled to the selected memory cell.

23. A method of performing a read operation of a nonvolatile memory device, the method comprising:

simultaneously applying a pass voltage to all word lines;

precharging a selected bit line;

changing the pass voltage applied to a selected word line among all the word lines into a read voltage;

applying the read voltage to the selected word line; and reading data of a memory cell coupled to the selected word line.

24. The method of claim 23, further comprises:

turning on a drain select transistor and a source select transistor when applying the pass voltage to all the word lines; and turning off the source select transistor when changing the pass voltage applied to the selected word line into the read voltage and applying the read voltage to the selected word line.

25. The method of claim 23, wherein when applying the pass voltage, both the drain select transistor and the source select transistor are turned on.

26. The method of claim 23, further comprises;

turning on the source select transistor again when a voltage level of the selected word line reaches the read voltage level, before reading data of the memory cell.

27. The method of claim 23, further comprises:

discharging the selected word line before applying the read voltage to the selected word line.

28. The method of claim 23, wherein the reading data of the memory cell further comprises:

evaluating a shift in a threshold voltage of the selected memory cell; and sensing a change in a voltage of the selected bit line coupled to the selected memory cell.

* * * * *